(12) United States Patent
Moore et al.

(10) Patent No.: US 12,720,667 B2
(45) Date of Patent: Aug. 25, 2026

(54) FLEXIBLE CIRCUITS CONFIGURED FOR HEAT SPREADING IN A WEARABLE DISPLAY

(71) Applicant: GOOGLE LLC, Mountain View, CA (US)

(72) Inventors: Joshua Moore, Elora (CA); Emil Rahim, San Jose, CA (US)

(73) Assignee: GOOGLE LLC, Mountain View, CA (US)

( * ) Notice: Subject to any disclaimer, the term of this patent is extended or adjusted under 35 U.S.C. 154(b) by 230 days.

(21) Appl. No.: 18/598,796

(22) Filed: Mar. 7, 2024

(65) Prior Publication Data

US 2025/0287495 A1 Sep. 11, 2025

(51) Int. Cl.

| | |
|---|---|
| ***H05K 1/02*** | (2006.01) |
| ***G02B 27/01*** | (2006.01) |
| ***H05K 1/03*** | (2006.01) |

(52) U.S. Cl.

CPC ....... *H05K 1/0209* (2013.01); *G02B 27/0172* (2013.01); *H05K 1/0298* (2013.01); *H05K 1/0393* (2013.01); *G02B 2027/0178* (2013.01); *H05K 2201/056* (2013.01); *H05K 2201/09227* (2013.01)

(58) Field of Classification Search

CPC .......................... H05K 1/0209; G02B 17/0172

See application file for complete search history.

(56) References Cited

U.S. PATENT DOCUMENTS

| | | | | |
|---|---|---|---|---|
| 10,048,722 | B2 * | 8/2018 | Huang | H10N 10/817 |
| 10,674,108 | B2 * | 6/2020 | Totani | G02B 27/0176 |
| 11,372,251 | B2 * | 6/2022 | Isaacs | G02B 27/0176 |

FOREIGN PATENT DOCUMENTS

| | | | |
|---|---|---|---|
| CN | 209693145 | U * | 11/2019 |
| CN | 219997420 | U | 11/2023 |
| WO | 2018219240 | A1 | 12/2018 |
| WO | 2024042422 | A1 | 2/2024 |

OTHER PUBLICATIONS

CN 209693145 U English translation (Year: 2019).*

* cited by examiner

*Primary Examiner* — Mukundbhai G Patel

(57) ABSTRACT

A head-worn display (HWD) configured to provide an extended reality (XR) image to a user include includes a flexible circuitry configured to electrically couple a component of the HWD to a processor or power source. Additionally, this flexible circuit includes a heat tab configured to thermally couple the flexible circuit to the component of the HWD. Due to the flexible circuitry being thermally coupled to the component of the HWD, heat generated by the component of the HWD is spread across the surfaces of the flexible circuitry, lowering the temperature of the component.

20 Claims, 7 Drawing Sheets

FLEXIBLE CIRCUITS CONFIGURED FOR HEAT SPREADING IN A WEARABLE DISPLAY

BACKGROUND

Head-worn displays (HWDs) are commonly configured to direct light representative of an image to the eye of a user such that the image is viewable to the user in a real-world space. To this end, some HWDs include a projector that includes one or more light-emitting components each configured to emit light, such as laser light, representative of at least a portion of an image toward a lightguide of the HWD. For example, the projector emits the light such that the light is first received at an incoupler of the lightguide. This incoupler then directs the light into the main body of the lightguide such that the light propagates through the body of the lightguide toward an outcoupler of the lightguide. The outcoupler then directs the received light out of the lightguide and toward the eyes of a user. The light directed by the outcoupler then forms an exit pupil near the eyes of the user, allowing the user to view the image represented by the light in a real-world space.

However, while the projectors of these HWDs are operating, the projectors generate heat based on the amount of power that the projectors consume. The heat generated by a projector, in turn, heats the portions of the HWD that encase the projector, such as a frame of the HWD. Heating these portions of the frame of the HWD in this way increases the likelihood that a hotspot forms on the frame of the HWD, making use of the HWD uncomfortable for the user and negatively impacting user experience.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

Figure 1:
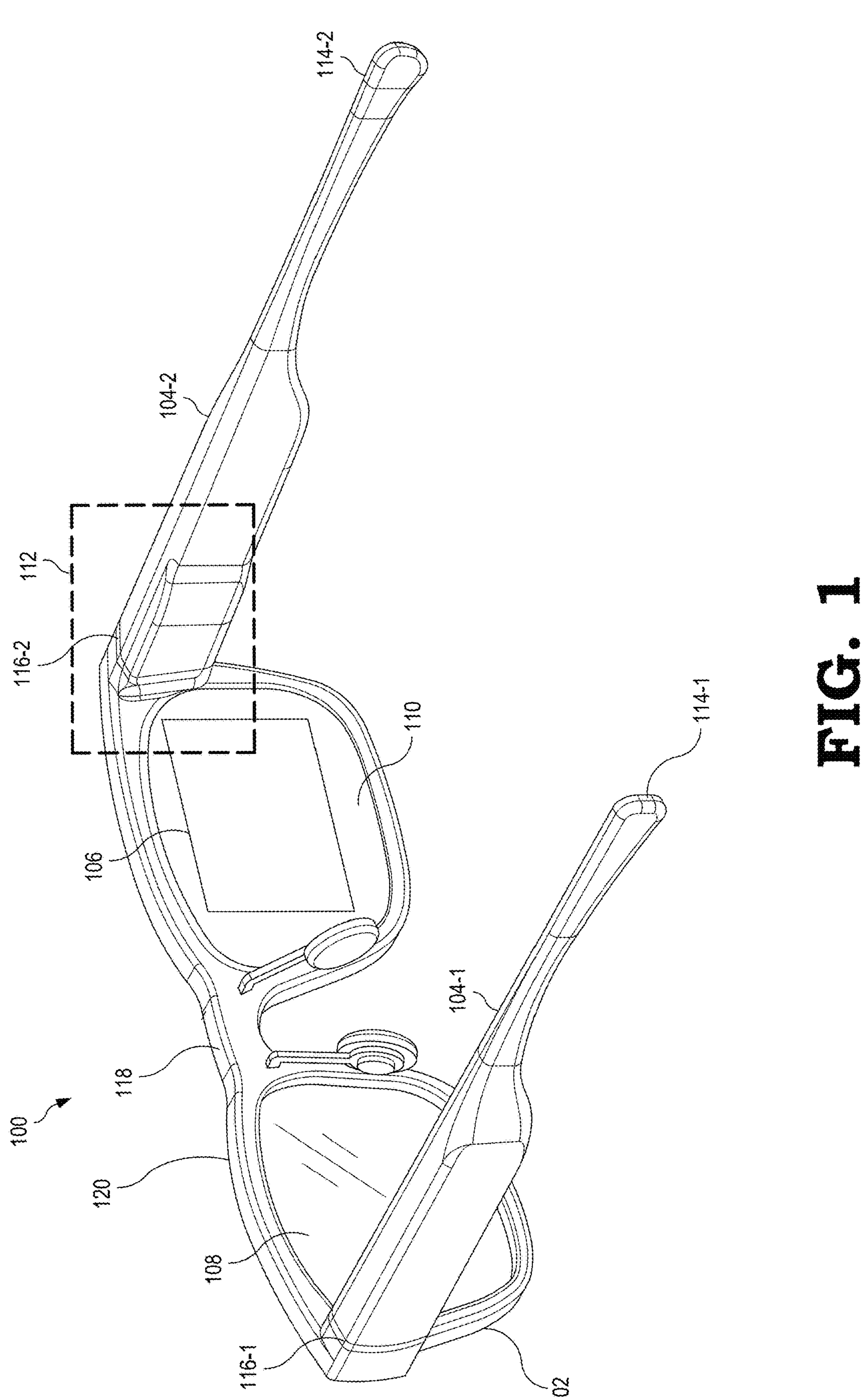
FIG. 1 is a diagram of an example display system housing a projection system and configured to spread heat using flexible circuits, in accordance with some embodiments.

Systems and techniques herein are directed to head-worn displays (HWDs) (e.g., extended reality HWDs) configured to direct light toward the eyes of a user such that one or more extended reality (XR) images are presented to the user. For example, an HWD has a housing (e.g., frame) resembling eyeglasses and includes one or more lenses containing a lightguide to direct light representative of an image to the eye of the user. Herein, the combination of the lens and lightguide is referred to as an "optical combiner," "optical combiner lens," or both. Such a lightguide, for example, includes one or more incouplers, exit pupil expanders (EPEs), and outcouplers configured to direct light representing an XR image from a projector to the eye of the user. As an example, the lightguide includes an incoupler configured to receive light representing an XR image emitted from a projector of a display circuitry and direct the received light into the lightguide such that the light propagates through the lightguide using total internal reflection (TIR), partial internal reflection (PIR), or both. The light then propagates through the lightguide until the light is received at an outcoupler of the lightguide. In response to receiving the light, the outcoupler directs the light out of the lightguide and towards the eye of the user such that the light forms an exit pupil representative of the XR image near the eye of the user. This exit pupil, for example, represents the location along the optical path where the beams of the light, as directed by the lightguide, intersect. Further, some lightguides include an exit pupil expander (EPE) configured to receive light from the incoupler and direct light towards the outcoupler. Such an EPE, for example, is further configured to direct the light toward the outcoupler such that the size of the exit pupil is increased (e.g., the exit pupil is expanded).

Further, to help improve user experience, some HWDs include additional circuitry that expands the functionality of the HWD. That is to say, in addition to a display circuitry to provide an XR image to a user, some HWDs include other circuitry that provides additional functionality. For example, some HWDs include a connectivity circuitry configured to communicatively couple the HWD to one or more other devices (e.g., smartphones, computers, tablets), a network (e.g., local area network, wide area network), or both using one or more wireless communication protocols (e.g., Bluetooth, Wi-Fi, cellular protocols). As another example, some HWDs include sensing circuitry configured to take one or more measurements of the user, the HWD, or both. The HWD then uses these measurements to determine the gaze of the user, focus of the user, objects in front of the user, a pose of the user, a location of the user, or any combination thereof. To this end, the sensing circuitry includes one or more cameras, infrared sensors, accelerometers, radar sensors, proximity sensors, and the like. As yet another example, some HWDs include audio circuitry that includes one or more speakers, digital signal processors, microphones, and the like configured to receive and output audio (e.g., music, sounds, voice) for one or more streaming applications, music applications, video applications, audio calling applications, video calling applications, and the like running on the HWD or a device communicatively coupled to the HWD.

Additionally, the HWD includes a processor configured to manage the functionalities of the circuitries (e.g., display circuitry, connectivity circuitry, sensing circuitry, audio circuitry), execute applications, manage power, or the like. To connect each circuitry to the processor, another circuitry, a power source (e.g., battery) of the HMD, or any combination thereof, the HWD includes one or more flexible circuits. These flexible circuits, for example, include one or more electrically conductive layers each having one or more traces (e.g., copper traces) configured to carry power, a signal, or both. To connect a circuitry to the processor, another circuitry, a power source (e.g., battery) of the HMD, or any combination thereof, a flexible circuit is configured to be disposed on a surface of the housing (e.g., frame) of the HWD or within the housing of the HWD such that the flexible circuit is connected at a first end to the circuitry and connected at a second end to the processor, another circuitry, a power source (e.g., battery) of the HWD, or any combination thereof. For example, a flexible circuit is disposed on a surface of or within the frame of an HWD such that the flexible circuit, at a first end, is connected to a first circuitry, runs along a brow of the frame, and is connected, at a second end, to the processor. As another example, a flexible circuit is disposed on a surface of or within the frame of an HWD such that the flexible circuit, at a first end, is connected to a first circuitry, runs through the hinge of the frame, runs along at least a portion of a temple of the frame, and is connected, at a second end, to a power source. To connect a flexible circuit to the processor, another circuitry, or a power source, the flexible circuit includes one or more connectors (e.g., board-to-board connectors) each disposed at a corresponding end of a flexible circuit. These connectors, for example, are configured to connect the flexible circuit to one or more circuitries, power sources, or both by mating with one or more pins, plugs, or both of the circuitries or power sources.

However, while each of the circuitries (e.g., display circuitry, connectivity circuitry, sensing circuitry, audio circuitry) are operating, they each generate an amount of heat based on the amount of power consumed by the circuitry. That is to say, one or more components of a circuitry increase in temperature based on the amount of power consumed by the circuitry. This increase in temperature by a circuitry, for example, causes the processor to throttle the performance of the circuitry, decrease power to the circuitry, or both so as to lower the temperature of the components. Additionally, such an increase in temperature by a circuitry causes one or more points on the housing (e.g., frame) of the HWD to increase in temperature, causing one or more hotspots on the housing of the HWD that are uncomfortable to the user. This discomfort to the user reduces the amount of time the user is able to operate the HMD and negatively impacts user experience.

As such, systems and techniques disclosed herein are directed to an HWD having one or more flexible circuits configured for heat spreading. To this end, one or more flexible circuits include a thermal tab disposed at one or both ends of the flexible circuit. These thermal tabs each include an amount of thermally conductive material, for example, copper, graphite, silver, gold, aluminum, or the like, that has a shape (e.g., bracket, square, circle) configured to thermally couple (e.g., mechanically couple so as to conduct heat generated from) to one or more circuitries. For example, a thermal tab is configured to mechanically couple to one or more heat-generating components of a circuitry such as a light engine, processor, sensor, microprocessor, or any combination thereof such that heat generated by the components is conducted by the flexible circuit. Due to the thermal tab thermally coupling a flexible circuit to a circuitry, heat generated by the circuitry is conducted by the flexible circuit, spreading the heat generated by the circuitry along the surfaces of the flexible circuit. Additionally, because the flexible circuit is disposed on a surface of or within the housing (e.g., frame) of the HWD, the heat generated by the circuitry is also spread out across the portion of the housing of the HWD along which the flexible circuit runs. For example, a flexible circuit is configured so as to spread heat conducted by a coupled circuitry along a brow or temple of the frame of the HWD along which the flexible circuit also runs. Further, to help the flexible circuit spread heat generated by a coupled circuitry, the flexible circuit includes a thermally conductive layer. This thermally conductive layer, for example, includes a layer of material (e.g., copper, graphite, silver, gold, aluminum) that runs along the length of the flexible circuit. Because the thermally conductive layer has a greater thermal conductivity than the electrically conductive layers of the flexible circuit, the amount of heat the flexible circuit is able to conduct (e.g., spread along the flexible circuit and the housing of the HMD) is increased.

In this way, the flexible circuits of the HWD are configured to spread heat generated by one or more coupled circuitries. Further, by spreading the heat generated by these circuitries, the temperature of the coupled circuitries is decreased, allowing the circuitries to increase processing speeds, power consumption, or both without overheating. Additionally, by spreading the heat generated by these circuitries, the likelihood of hotspots occurring on the housing of the HWD is reduced, helping to improve the comfort of the user and to improve the user experience.

FIG. 1 illustrates an example display system 100 housing a projection system and configured to dissipate heat using flexible circuits, in accordance with embodiments. In embodiments, the display system 100 includes a support structure 102 having an arm 104, which houses a projection system configured to project XR images toward the eye of a user such that the user perceives the projected XR images as being displayed in a field of view (FOV) area 106 of a display at one or both of lens elements 108, 110. In the depicted embodiment, the display system 100 is an eyewear display that includes a support structure 102 configured to be worn on the head of a user and has a general shape and appearance of an eyeglasses (e.g., sunglasses) frame. For example, referring to the example embodiment in FIG. 1, the support structure 102 includes a first portion 120 configured to contain lens elements 108, 110. Additionally, this first portion 120 includes a surface that forms a brow 118 of the support structure 102. Further, the support structure includes a first arm 104-1 terminating at a first end in a first temple 114-1 and mechanically coupled at a second, opposite end to the first portion 120 by a first hinge 116-1. The first hinge 116-1, for example, is configured to move so as to change the first arm 104-1 from a first position (e.g., vertical position) perpendicular to the first portion 120 to a second position (e.g., horizontal position) parallel to the first portion 120. In embodiments, the support structure 102 also includes a second arm 104-2 terminating at a first end in a second temple 114-2 and mechanically coupled at a second, opposite end to the first portion 120 by a second hinge 116-2. The second hinge 116-2, for example, is configured to move so as to change the second arm 104-2 from a first position (e.g., vertical position) perpendicular to the first portion 120 to a second position (e.g., horizontal position) parallel to the first portion 120. Further, according to embodiments, the support structure 102 contains or otherwise includes various components of a projection system to facilitate the projection of such images toward the eye of the user, such as a display circuitry (e.g., projector, optical scanner, microdisplay, μLED projector, liquid crystal on silicon (LCOS) projector) and a lightguide.

In embodiments, one or both of the lens elements 108, 110 contained by support structure 102 are used by the display system 100 to provide an XR display in which rendered graphical content can be superimposed over or otherwise provided in conjunction with a real-world view as perceived by the user through the lens elements 108, 110. For example, light used to form a perceptible XR image or series of XR images may be projected by a projection system of the display system 100 onto the eye of the user via a series of optical path components, such as a lightguide formed at least partially in the corresponding lens element, one or more scan mirrors, one or more optical relays, one or more lenses, or any combination thereof. In embodiments, one or both of the lens elements 108, 110 include at least a portion of a lightguide that routes display light received by an incoupler of the lightguide to an outcoupler of the lightguide, which outputs the display light toward an eye of a user of the display system 100. The display light is imaged onto the eye of the user such that the user perceives the display light as an image. In addition, each of the lens elements 108, 110 is sufficiently transparent to allow a user to see through the lens elements to provide a field of view of the user's real-world environment such that the XR image appears superimposed over at least a portion of the real-world environment.

In some embodiments, the projection system is a digital light processing-based projector, a microdisplay, a scanning laser projector, a LCoS projector, or any combination of a modulative light source such as a laser or one or more LEDs (e.g., μLEDs) and a dynamic reflector mechanism such as one or more dynamic scanners or digital light processors. The projection system is communicatively coupled to the controller and a non-transitory processor-readable storage medium or memory storing processor-executable instructions and other data that, when executed by the controller, cause the controller to control the operation of the light engine. In some embodiments, the controller controls a scan area size and scan area location for the light engine and is communicatively coupled to a processor (not shown) that generates content to be displayed at the display system 100. The projection system scans light over a variable area, designated the FOV area 106, of the display system 100. The scan area size corresponds to the size of the FOV area 106 and the scan area location corresponds to a region of one of the lens elements 108, 110 at which the FOV area 106 is visible to the user. Generally, it is desirable for a display to have a wide FOV to accommodate the outcoupling of light across a wide range of angles. Herein, the range of different user eye positions that will be able to see the display is referred to as the eyebox of the display.

In embodiments, the support structure 102 contains or otherwise includes components of additional circuitries that add further functionality to the display system 100. For example, according to embodiments, the support structure 102 contains or otherwise includes a sensing circuitry configured to take one or more measurements of the user, the HWD, the environment surrounding the user, or any combination thereof. The display system 100 then uses such measurements to track the gaze of the user, determine where a user is looking, determine objects in front of the user, determine a pose of the user, determine a pose of the display system 100, determine a location of the user, or any combination thereof. To take such measurements, the sensing circuitry includes various sensors, such as one or more front-facing cameras, rear-facing cameras, other light sensors, motion sensors, accelerometers, radar sensors, proximity sensors, infrared sensors, GPS sensors, and the like. As another example, in embodiments, the support structure 102 contains or otherwise includes a connectivity circuitry configured to communicatively couple the display system 100 to one or more other devices (e.g., smartphones, laptops, computers, tablets, wearable devices), networks (e.g., local area networks, wide area networks, cellular networks, the internet), or both using one or more wireless communication protocols, for example, Bluetooth protocols, cellular (e.g., 2G, 3G, 4G, 5G) protocols, WI-FI protocols, or the like. To communicatively couple the display system 100 to one or more other devices, networks, or both, the connectivity circuitry includes one or more radio frequency (RF) interfaces or other wireless interfaces, such as a Bluetooth™ interface, a WI-FI interface, and the like. As yet another example, in some embodiments, the support structure 102 contains or otherwise includes an audio circuitry configured to receive and output audio such as music, voice, noises, and the like. For example, the audio circuitry is configured to receive and output audio for one or more applications running on the display system 100 or a device connected to the display system 100 such as streaming applications, music applications, video applications, audio calling applications, video calling applications, and the like. To receive and output audio for these applications, the audio circuitry includes one or more speakers, microphones, digital signal processors, and the like, Further, in some embodiments, the support structure contains or otherwise includes one or more processors configured to execute applications, manage the functionality of the circuitries (e.g., display circuitry, sensing circuitry, connectivity circuitry, audio circuitry), manage power, or any combination thereof. Such processors, for example, include one or more central processing units (CPUs), graphics processing units (GPUs), microcontrollers, power controllers, programmable logic devices, and the like. According to embodiments, the support structure 102 further contains or otherwise includes one or more power sources (e.g., batteries or other portable power sources) for supplying power to the circuitries (e.g., display circuitry, sensing circuitry, connectivity circuitry, audio circuitry) and processors of the display system 100. Additionally, in embodiments, to connect each circuitry of the display system 100 to another circuitry, power source, processor, or any combination thereof, the display system 100 includes one or more flexible circuits. These flexible circuits, for example, include one or more electrically conductive layers each configured to carry a signal or power from a first end of the layer to a second end of the layer. For example, each electrically conductive layer of a flexible circuit includes a flexible material (e.g., a flexible polymer, polyimide film) having one or more traces (e.g., copper traces) configured to carry one or more signals, power, or both from a first end of the layer to a second end of the layer. To connect a circuitry to another circuitry, processor, or power source, a flexible circuit, at a first end, is first electrically coupled to the circuitry. The flexible circuit then runs along a portion of an outer surface or an interior surface of the support structure 102 and is electrically coupled, at a second end, to the other circuitry, processor, or power source. To electrically couple a flexible circuit to a circuitry, processor, or power source, a flexible circuit includes one or more connectors each disposed at a corresponding end of the flexible circuit. Each connector, for example, includes one or more pins, contacts, or both configured to electrically couple one or more layers of the flexible circuit to the pins or contacts of a mated connector (e.g., another connector mated to the connector of the flexible circuit).

In some embodiments, some or all of these components of the circuitries (e.g., display circuitry, sensing circuitry, connectivity circuitry, audio circuitry) and processors of the display system 100 are fully or partially contained within an inner volume of support structure 102, such as within the arm 104 in region 112 of the support structure 102. However, while a circuitry of the display system 100 is operating, one or more components of the circuitry are configured to generate an amount of heat based on the amount of power consumed by the component. As an example, while a display circuitry of the display system 100 is operating, the light engine and optical scanner both generate an amount of heat based on the amount of power consumed. As another example, while a sensing circuitry of the display system 100 is operating one or more cameras, sensors, or both generate an amount of heat based on the amount of power consumed. As yet another example, while a connectivity circuitry of the display system 100 is operating, one or more RF or wireless interfaces generate an amount of heat based on the amount of power consumed. Due to the heat the components of these circuitries produce, the temperature of the circuitries is increased, requiring a processor of the display system 100 to throttle or reduce power to the circuitry so as to lower the temperature of the circuitry. Additionally, the heat generated by the components of these circuits causes portions of the support structure 102 to increase in temperature, causing one or more hotspots to form on the support structure 102. These hotspots cause discomfort in the user, limiting the user's ability to use the display system 100 and negatively impacting user experience.

To this end, in embodiments, the display system 100 includes one or more flexible circuits configured to spread the heat generated by one or more components of one or more circuitries. For example, according to embodiments, one or more flexible circuits include one or more thermal tabs configured to thermally couple a flexible circuit to one or more components of a circuitry such that the flexible circuit conducts the heat generated by the components. Such thermal tabs, for example, are formed from a thermally conductive material (e.g., copper, graphite, silver, gold, aluminum) in a shape (e.g., bracket, rectangle, circle) configured to mechanically couple to one or more components of a circuitry such that the flexible circuit is thermally coupled to the components. Due to a flexible circuit being thermally coupled to the components of a circuitry, at least a portion of the heat generated by the components is conducted by the flexible circuit such that the portion of heat is spread across the surfaces (e.g., layers) of the flexible circuit. Additionally, because the flexible circuit is disposed within or on a surface of the portion of the support structure 102, the flexible circuit is configured to spread heat from components of a circuitry to one or more portions of the support structure 102 proximate to the flexible circuit. That is to say, the flexible circuit is configured to spread heat from the components of a circuitry to the portions of the support structure 102 along with the flexible circuit runs. As an example, in embodiments, the flexible circuit running along the brow 118, first hinge 116-1, and first arm 104-1 of the support structure 102 is configured to spread heat generated by components of a circuitry to at least a portion of the brow 118, first hinge 116-1, and first arm 104-1. As another example, according to embodiments, a flexible circuit running along the first arm 104-1 and first temple 114-1 is configured to spread heat generated by components of a circuitry to at least a portion of the first arm 104-1 and first temple 114-1.

To help increase the amount of heat spread by a flexible circuit, in embodiments, the flexible circuit includes one or more thermally conductive layers. These thermally conductive layers, for example, include a layer of thermally conductive material (e.g., copper, graphite, silver, gold, aluminum) within or disposed on the flexible circuit. Because these thermally conductive layers have a greater thermal conductivity than the electrically conductive layers of the flexible circuit, the amount of heat able to be spread by the flexible circuit is increased. In this way, the flexible circuits of the display system 100 are configured to spread heat generated by one or more coupled components of one or more circuitries. By spreading the heat generated by the components of these circuitries, the temperature of the circuitries is decreased, allowing the circuitries to increase processing speeds, power consumption, or both without overheating. Additionally, by spreading the heat generated by these circuitries across the flexible circuits and the support structure 102, the likelihood of hotspots occurring on the support structure 102 is reduced, helping to improve the comfort of the user and to improve the user experience.

It should be noted that while an example form factor is depicted, it will be appreciated that in other embodiments the display system 100 may have a different shape and appearance from the eyeglasses frame depicted in FIG. 1.

Figure 2:
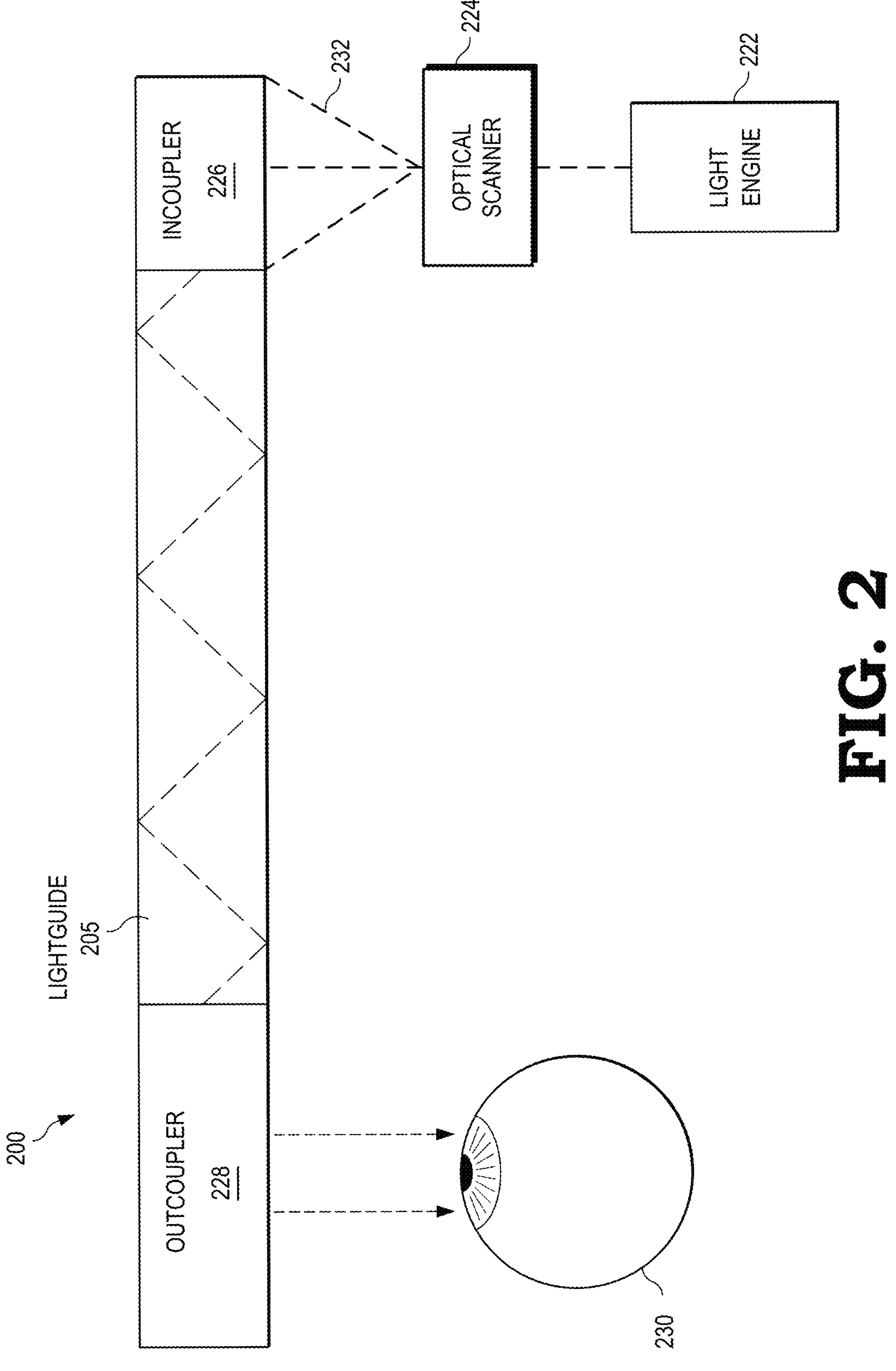
FIG. 2 is a diagram illustrating a projection system that projects images directly onto the eye of a user, in accordance with some embodiments.

FIG. 2 illustrates a simplified block diagram of a projection system 200 that projects XR images directly onto the eye of a user via light, in accordance with embodiments. The projection system 200 includes a lightguide 205 and display circuitry that includes light engine 222, optical scanner 224, or both. The lightguide 205 includes an incoupler 226 and an outcoupler 228, with the outcoupler 228 being optically aligned with an eye 230 of a user in the present example. In some embodiments, the projection system 200 is implemented in an HWD, such as the display system 100 of FIG. 1.

The light engine 222 includes one or more light sources configured to generate and output light 232 (e.g., visible laser light such as red, blue, and green laser light and/or non-visible laser light such as infrared laser light) representative of an XR image. In some embodiments, the light engine 222 is coupled to a driver or other controller (not shown), which controls the timing of emission of light from the light sources of the light engine 222 in accordance with instructions received by the controller or driver from a computer processor coupled thereto to modulate the light 232 to be perceived as images when output to the retina of an eye 230 of a user. For example, during the operation of the projection system 200, multiple laser light beams having respectively different wavelengths are output by the light sources of the light engine 222, then combined via a beam combiner (not shown), before being directed to the eye 230 of the user. The light engine 222 modulates the respective intensities of the light beams so that the combined light reflects a series of pixels of an XR image, with the particular intensity of each light beam at any given point in time contributing to the amount of corresponding color content and brightness in the pixel being represented by the combined light at that time.

In embodiments, the lightguide 205 of the projection system 200 includes the incoupler 226 and the outcoupler 228. The term "lightguide," as used herein, will be understood to mean a combiner using one or more of TIR, PIR, specialized filters, and/or reflective surfaces, to transfer light from an incoupler (such as the incoupler 226) to an outcoupler (such as the outcoupler 228). In general, the terms "incoupler" and "outcoupler" will be understood to refer to a set of any type of optical structures, including, but not limited to, diffraction grating structures, reflectors, mirrors, holograms, holographic optical elements (e.g., optical elements using one or more holograms), volume diffraction grating structures, volume holograms, surface relief diffraction grating structures, surface relief holograms, or any combination thereof.

In the present example presented in FIG. 2, the display light 232 received at the incoupler 226 is relayed to the outcoupler 228 via the lightguide 205 using TIR, PIR, or both. The display light 232 is then output to the eye 230 of a user via the outcoupler 228. In embodiments, one or more elements (e.g., incoupler 226, outcoupler 228, EPE) of the lightguide 205 are configured to apply an optical power to the light 232 provided from light engine 222. For example, the incoupler 226 of the lightguide 205 includes a set of gratings (e.g., transmissive gratings, reflective gratings) configured to apply a first optical power to received light. In this way, the light 232 provided by light engine 222 has an optical power applied to it as the light 232 propagates through the lightguide 205. As described above, in some embodiments the lightguide 205 is implemented as part of an eyeglass lens, such as the lens element 108 or lens element 110 (e.g., FIG. 1) of the display system having an eyeglass form factor and employing the projection system 200.

According to some embodiments, light engine 222 is configured to directly provide light 232 to the incoupler 226 of the lightguide 205 while in other embodiments, light engine 222 first provides light 232 to an optical scanner 204. The optical scanner 204 is configured to receive light 232 and scan light 232 in one or more directions toward incoupler 226 of lightguide 205. To this end, the optical scanner 204 includes one or more scan mirrors (e.g., MEMS mirrors) configured to scan received light in one or more directions (e.g., about one or more axes) and one or more optics relays configured to relay received light to a second point (e.g., incoupler 226). As an example, optical scanner 204 includes one or more MEMS mirrors that are driven by respective actuation voltages to oscillate in one or more directions (e.g., about one or more axes) during active operation of the projection system 200, causing the MEMS mirrors to scan the light 232 in one or more directions. Additionally, the optical scanner 204 includes one or more optical relays each including lenses, reflectors, or both configured to relay scanned light from a first scan mirror to a second scan mirror, relay scanned light from a scan mirror to incoupler 226, or both. For example, an optical relay includes a reflective relay, 2F relay, 4F relay, or any combination thereof configured to relay scanned light from a first scan mirror to a second scan mirror, incoupler 226, or both. In embodiments, an optical relay of the optical scanner 204 includes a line-scan relay configured to, for example, receive light scanned in one or more directions from a first scan mirror and relay the scanned light to a second scan mirror, the incoupler 226, or both such that the scanned light converges in the one or more directions to an exit pupil beyond the second scan mirror, the incoupler 226, or both. An exit pupil, for example, refers to the location along the optical path where beams of light intersect. According to embodiments, the width (e.g., smallest dimension) of a given exit pupil approximately corresponds to the diameter of the light 232 corresponding to that exit pupil.

Although not shown in the example of FIG. 2, in some embodiments, additional optical components are included in any of the optical paths between the light engine 222 and the optical scanner 204, between the optical scanner 204 and the incoupler 226, between the incoupler 226 and the outcoupler 228, between the outcoupler 228 and the eye 230 (e.g., in order to shape the display light for viewing by the eye 230 of the user), or any combination thereof. In some embodiments, a prism is used to steer display light from the optical scanner 204 into the incoupler 226 so that display light is coupled into incoupler 226 at the appropriate angle to encourage the propagation of the display light in lightguide 205 by TIR. Also, in some embodiments, an exit pupil expander (EPE), such as a set of fold grating structures, is arranged in an intermediate stage between incoupler 226 and outcoupler 228 to receive display light that is coupled into lightguide 205 by the incoupler 226, expand the display light, and redirect the display light towards the outcoupler 228, where the outcoupler 228 then couples the display light out of lightguide 205 (e.g., toward the eye 230 of the user). Additionally, in embodiments, one or more components of projection system 200 are thermally coupled to one or more flexible circuits such that the flexible circuits spread the heat generated by the components across the flexible circuits, a portion of a support structure 102, or both. For example, according to some embodiments, optical scanner 224, light engine 222, or both are mechanically coupled to a thermal tab of a flexible circuit such that the optical scanner 224, light engine 222, or both are thermally coupled to a flexible circuit. The flexible circuit is then configured to spread heat generated by optical scanner 224, light engine 222, or both across one or more surfaces (e.g., layers) of the flexible circuit and one or more portions of a support structure 102 including or otherwise containing the optical scanner 224, light engine 222, or both.

Figure 3:
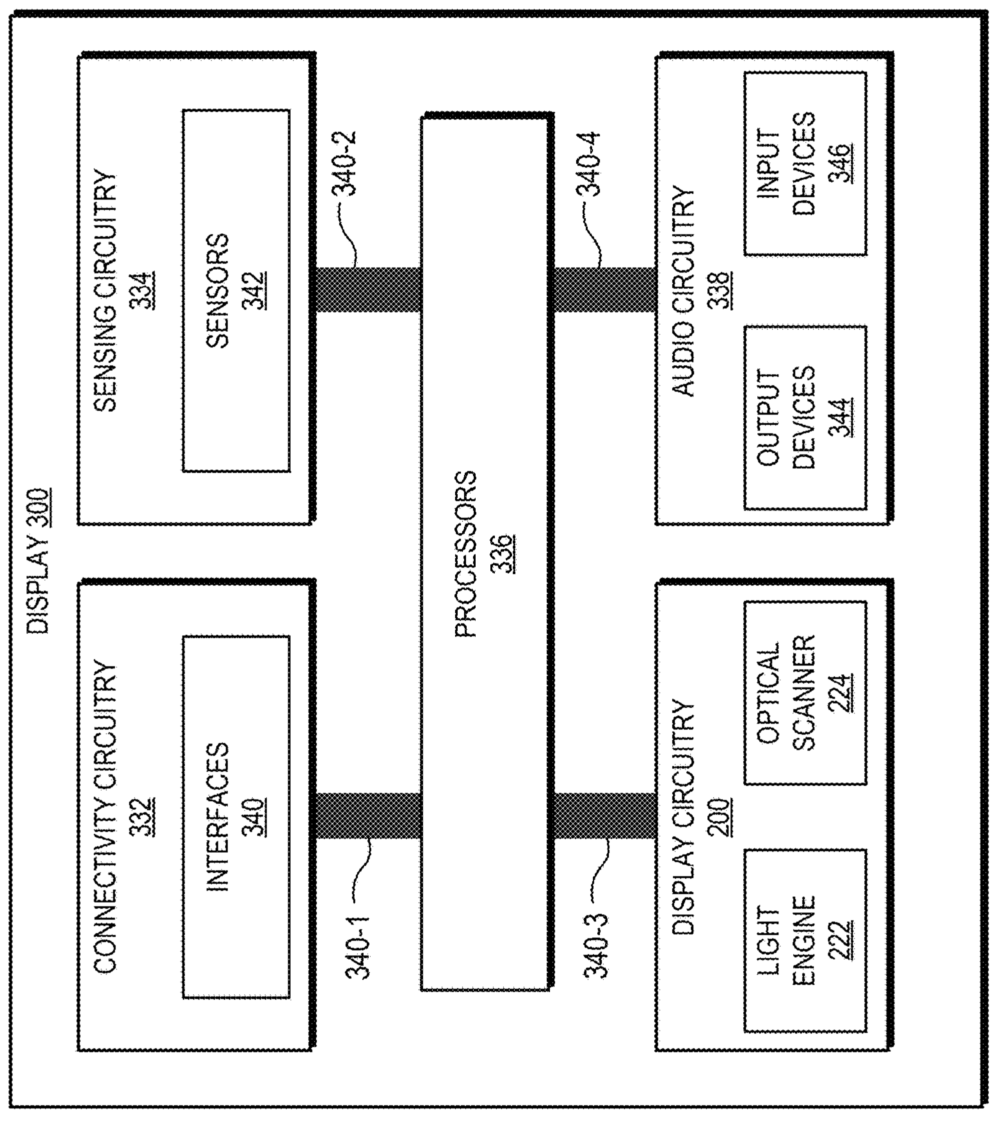
FIG. 3 is a block diagram of an example display having one or more heat-generating components, in accordance with some embodiments.

Referring now to FIG. 3, an example display system 300 having one or more heat-generating components is presented, in accordance with embodiments. In embodiments, example display system 300 is implemented as at least a portion of display system 100. According to embodiments, example display system 300 includes one or more circuitries each configured to provide a functionality to the example display system 300 and each including one or more components configured to generate heat while operating. For example, in some embodiments, example display system 300 includes a connectivity circuitry 332 configured to communicatively couple the example display system 300 to one or more devices, networks, or both such that the example display system 300 is able to transmit and receive data from the one or more devices, networks, the Internet, or any combination thereof. Such devices, for example, include smartphones, wearable devices (e.g., smart watches, smart rings, fitness trackers), computers, laptop computers, tablet computers, and the like. Additionally, such networks include, for example, local area networks, wide area networks, cellular networks (e.g., 2G networks, 3G networks, 4G networks, 5G networks), or any combination thereof. To communicatively couple the example display system 300 to one or more devices, networks, or both, connectivity circuitry includes one or more components such as interfaces 305. These interfaces 305, for example, include one or more RF interfaces, wireless interfaces (e.g., Bluetooth interfaces, WI-FI interfaces, cellular interfaces), or both each having circuitry configured to communicatively couple the example display system 300 to one or more devices, networks, or both using one or more communication protocols (e.g., Bluetooth protocols, WI-FI protocols, cellular protocols). In embodiments, one or more interfaces 305 generate heat while operating. For example, one or more interfaces 305 generate an amount of heat based on the amount of power consumed by the interfaces 305.

According to embodiments, example display system 300 further includes sensing circuitry 334 configured to take one or more measurements of the user, display system 300, or both. As an example, sensing circuitry 334 is configured to take one or more measurements indicating the acceleration of the user or display system 300, the direction of the gaze of the user, the presence of objects in front of the user, the location of the user or display system 300, or any combination thereof, to name a few. Based on these measurements, for example, display system 300, using processors 348, is configured to determine a pose of the user of display system 300, a location of the user or display system 300, objects in front of the user, a gaze of the user, a focus of the user, or any combination thereof, to name a few. To take these measurements, sensing circuitry 334 includes one or more sensors 342 such as accelerometers, front-facing cameras, rear-facing cameras, infrared sensors, GPS sensors, radar sensors, proximity sensors, or the like. In embodiments, one or more sensors 342 generate heat while operating. For example, one or more sensors 342 generate an amount of heat based on the amount of power consumed by the interfaces 305. According to some embodiments, display system 300 further includes audio circuitry 338 configured to output and receive music, sounds, voice, or any combination thereof for one or more applications running on the display system 300 (e.g., via processors 348), a device communicatively coupled to the display system (e.g., connectivity circuitry 332), or both. To output such music, sounds, voice, or any combination thereof, audio circuitry 338 includes one or more output devices 344 such as speakers, buzzers, alarms, digital-to-analog converters, and the like. Further, to input such music, sounds, voice, or any combination thereof, audio circuitry 338 includes one or more input devices 346 such as one or more microphones, analog-to-digital converters, or both. In embodiments, one or more output devices 344, input devices 346, or both generate heat while operating. For example, one or more output devices 344, input devices 346, or both generate an amount of heat based on the amount of power consumed by the output devices 344 and input devices 346.

In embodiments, example display system 300 further includes display circuitry 336. Such a display circuitry 336, in embodiments, is implemented within projection system 200 and is configured to facilitate the presentation of an XR image to a user. To this end, display circuitry 336 includes light engine 222 and optical scanner 224. According to embodiments, light engine 222, optical scanner 224, or both generate heat while operating. For example, light engine 222, optical scanner 224, or both generate an amount of heat based on the amount of power consumed by the light engine 222 and optical scanner 224, respectively. As an example, as light engine 222 emits light 232 representing XR images with greater resolutions, the amount of power consumed by and the amount of heat generated by light engine 222 is increased.

To manage the operation of connectivity circuitry 332, sensing circuitry 334, display circuitry 336, audio circuitry 338, or any combination thereof, example display system 300 also includes one or more processors 348. Each processor 348, for example, includes a CPU, GPU, microprocessor, power controller, programmable logic device, or any combination thereof. In embodiments, one or more processors 348 are configured to run one or more applications. To execute these applications, the processors 348 send data representing instructions, operations, or both to be performed by connectivity circuitry 332, sensing circuitry 334, display circuitry 336, audio circuitry 338, or any combination thereof. To electrically couple the connectivity circuitry 332, sensing circuitry 334, display circuitry 336, audio circuitry 338, or any combination thereof to one or more processors 348, power sources (not pictured for clarity), or both, example display system 300 includes one or more flexible circuits 340. Each flexible circuit 340, for example, includes one or more flexible electrically conductive layers each configured to carry one or more signals or power from a first end of the flexible circuit 340 to a second, opposite end of the flexible circuit 340. According to embodiments, each layer of a flexible circuit 340 is formed from a flexible material such as a flexible polymer, a polyimide film, or the like. Additionally, to enable an electrically conductive layer to carry one or more signals or power, each electrically conductive layer includes one or more traces formed from an electrically conductive material such as copper, silver, gold, and the like. These traces are each configured to provide a path for a signal or power from a first end of the flexible circuit to a second, opposite end of the flexible circuit.

Referring to the example embodiment presented in FIG. 3, example display system 300 includes a first flexible circuit 340-1 configured to electrically couple connectivity circuitry to one or more processors 348, a second flexible circuit 340-2 configured to electrically couple sensing circuitry 334 to one or more processors 348, a third flexible circuit 340-3 configured to electrically couple display circuitry 336 to one or more processors 348, and a fourth flexible circuit 340-4 configured to electrically couple audio circuitry 338 to one or more processors 348. Though the example embodiment presented in FIG. 3 shows example display system 300 as including four flexible circuits, in other embodiments, example display system 300 can include any number of flexible circuits 340.

According to embodiments, each flexible circuit 340 is disposed on a surface of or within a support structure (e.g., support structure 102) of the example display system 300 such that the flexible circuit 340 runs along a corresponding portion of the support structure. In this way, each flexible circuit 340 is configured to carry a signal or power from a circuitry (e.g., connectivity circuitry 332, sensing circuitry 334, display circuitry 336, audio circuitry 338) at a first location in the display system 300 (e.g., at a first location within the support structure) to one or more processors 348 or a power source at a second location in the display system 300 (e.g., at a second location within the support structure. As an example, in embodiments, a flexible circuit 340 is configured to electrically couple a circuitry in a first arm 104-1 of a support structure to a processor 348 in a second arm 104-2 of the support structure by running along at least a portion of the first arm 104-1, a first hinge 116-1, a brow 118, a second hinge 116-2, and the second arm 104-2. As another example, a flexible circuit 340 is configured to electrically couple a circuitry in a first hinge 116-1 of a support structure to a power source in a first arm 104-1 of the support structure by running along at least a portion of the first hinge 116-1 and the first arm 104-1. In some embodiments, one or more flexible circuits 340 are configured to help spread the heat generated by one or more circuitries (e.g., one or more components of one or more circuitries). For example, a flexible circuit 340 configured to carry a signal from a first circuitry at a first portion of a support structure to a processor 348 at a second portion of the support structure further includes a thermal tab configured to thermally couple the flexible circuit 340 to one or more components of the first circuitry. Due to the flexible circuit 340 being thermally coupled to the components of the first circuitry, the flexible circuit 340 spreads the heat generated by the components across the surfaces of the flexible circuit 340 and the portions of the support structure along which the flexible circuit 340 runs.

Figure 4:
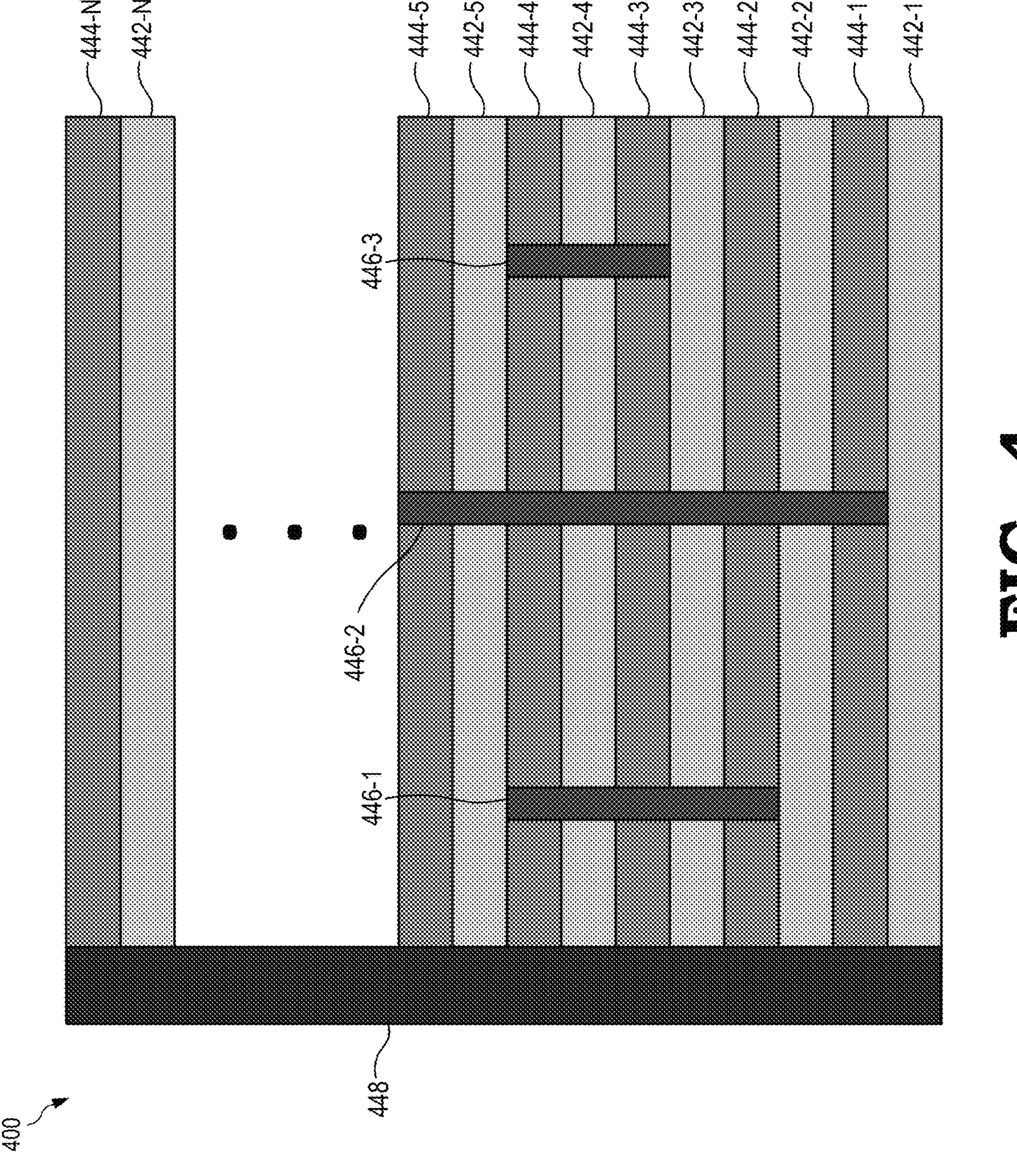
FIG. 4 is a diagram of an example flexible circuit, in accordance with some embodiments.

Referring now to FIG. 4, an example flexible circuit 400 is presented, in accordance with some embodiments. In embodiments, example flexible circuit 400 is implemented in example display system 300 as a flexible circuit 340. According to embodiments, example flexible circuit 400 includes one or more electrically conductive layers 444. Each electrically conductive layer 444, for example, is formed from a flexible material (e.g., flexible polymer, polyimide film) that allows the example flexible circuit 400 to run along at least a portion of a support structure. Additionally, each electrically conductive layer 444 includes one or more traces configured to carry one or more signals or power from a first end of the example flexible circuit 400 to a second, opposite end of the example flexible circuit 400. Such traces, for example, are formed from an electrically conductive material (e.g., copper, silver gold) and run from a first point of the electrically conductive layer 444 to a second point of the electrically conductive layer 444. According to embodiments, example flexible circuit 400 also includes one or more interlayers 442. Each interlayer 442, for example, is formed from a flexible electrically insulating material, such as a flexible polymer, polyimide film, dialectic material, prepeg, or the like. In embodiments, each interlayer 442, is configured to adhere two electrically conductive layers 444 together. To this end, each interlayer 442 is disposed between a first electrically conductive layer 444 and a second electrically conductive layer 444 and includes an adhesive (e.g., epoxy, acrylic-based adhesive) disposed on a first surface of the interlayer 442 (e.g., to adhere the first electrically conductive layer 444) and a second surface of the interlayer 442 (e.g., to adhere the second electrically conductive layer 444). Though the example embodiment presented in FIG. 4 shows example flexible circuit 400 as including six electrically conductive layers 444-1, 444-2, 444-3, 444-4, 444-5, 444-N representing an N number of electrically conductive layers 444 and six interlayers 442-1, 442-2, 422-3, 422-4, 422-5, 422-M representing an M number of interlayers 422, in other embodiments, example flexible circuit 400 can include any number of electrically conductive layers 444 and any number of interlayers 442. In some embodiments, example flexible circuit 400 includes the same number of electrically conductive layers 444 and interlayers 442 while in other embodiments example flexible circuit 400 includes a first number of electrically conductive layers 444 and a second, different number of interlayers 442.

According to some embodiments, example flexible circuit 400 also includes one or more vias 446. Each via 446, for example, is configured to electrically couple one or more traces of a first electrically conductive layer 444 to one or more traces of one or more other electrically conductive layers 444. To this end, each via 446, for example, is formed from an electrically conductive material such as copper, silver, gold, or the like. Referring to the example embodiment of FIG. 4, example flexible circuit 400 includes a first via 446-1 configured to electrically couple one or more traces from electrically conductive layer 444-4 to one or more traces of electrically conductive layers 444-2, 444-3, a second via 446-2 configured to electrically couple one or more traces from electrically conductive layer 444-5 to one or more traces of electrically conductive layers 444-1, 444-2, 444-3, 444-4, and a third via 446-3 configured to electrically couple one or more traces from electrically conductive layer 444-4 to one or more traces of electrically conductive layer 444-3. Though the example embodiment presented in FIG. 4 shows example flexible circuit 400 as including three vias 446-1, 446-2, 446-3, in other embodiments, example flexible circuit 400 can include any number of via 446.

In embodiments, to electrically couple one or more electrically conductive layers 444 to one or more circuitries, processors 348, power sources, or any combination thereof, example flexible circuit 400 includes one or more connectors 448. Each connector 448, for example, is disposed at a corresponding end (e.g., first end, second end) of example flexible circuit 400. Further, each connector 448 includes a non-electrically conductive housing (e.g., plastic housing) containing one or more pins or contacts each electrically coupled to corresponding traces on respective electrically conductive layers 444. To electrically couple one or more electrically conductive layers 444 to one or more circuitries, processors 348, power sources, or any combination thereof, each connector 448 of the example flexible circuit 400 is configured to mate with a connector of the circuitry, processor 348, or power source (e.g., a connector of the circuit board including the circuitry, processor 348, or power source) such that the circuitry, processor 348, or power source is electrically coupled to one or more traces of one or more electrically conductive layers 444. However, because a connector 448 is configured to mate with another connector of a circuit, processor 348, or power source, the connector 448 is in contact with the other connector rather than a component that generates heat, preventing the connector 448 from thermally coupling the flexible circuit 400 to the component. Additionally, in embodiments, the connector 448 includes a non-thermally conductive material, such as plastic, further preventing the connector 448 from thermally coupling the flexible circuit 400 to a component that generates heat. To this end, according to embodiments, example flexible circuit 400 includes one or more thermal tabs.

Figure 5:
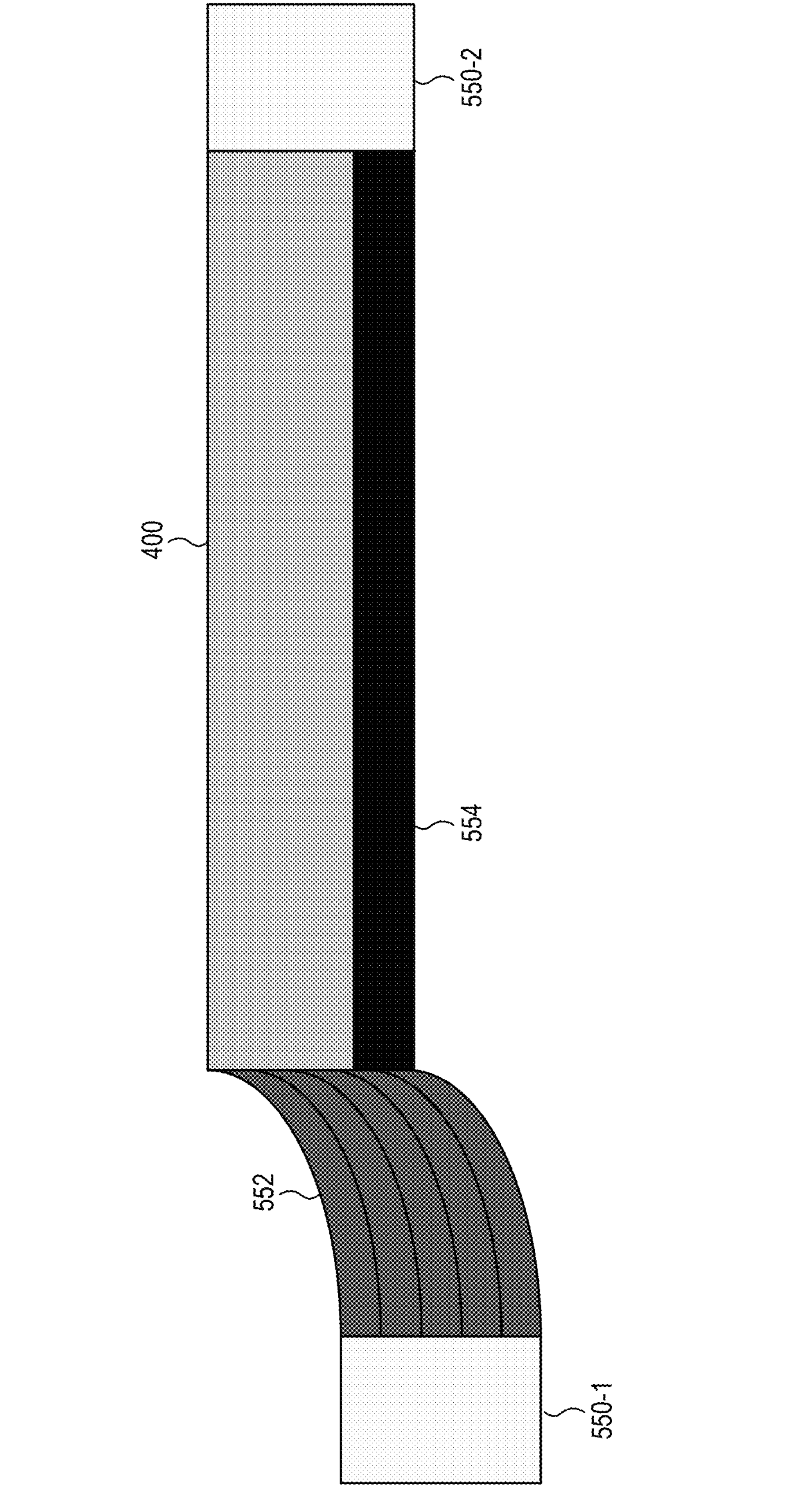
FIG. 5 is a diagram of an example flexible circuit configured for heat spreading, in accordance with embodiments.

For example, referring now to FIG. 5, a heat-spreading configuration 500 for a flexible circuit is presented, in accordance with embodiments. In embodiments, heat-spreading configuration 500 is implemented in example flexible circuit 400. According to embodiments, heat-spreading configuration 500 includes example flexible circuit 400 including one or more thermal tabs. For example, in the embodiment presented in FIG. 5, example flexible circuit 400 includes a first thermal tab 550-1 disposed at a first end of the example flexible circuit 400 and a second thermal tab 550-2 disposed at a second, opposite end of the example flexible circuit 400. Each thermal tab 500, for example, is thermally coupled to one or more layers (e.g., electrically conductive layers 444, interlayers 442) of the example flexible circuit 400. That is to say, each thermal tab is configured to transfer heat to one or more layers (e.g., electrically conductive layers 444, interlayers 442) of the example flexible circuit 400. Further, each thermal tab 550 is formed from a thermally conductive material such as copper, graphite, silver, gold, aluminum, or the like and has a shape (e.g., bracket, rectangle, circle) mechanically coupleable to one or more components (e.g., interfaces 305, sensors 342, light engine 222, optical scanner 224, output devices 344, input devices 346) of one or more circuitries (e.g., connectivity circuitry 332, sensing circuitry 334, display circuitry 336, audio circuitry 338). For example, a thermal tab 500 is configured to be mechanically coupled to a component of a circuitry such that the example flexible circuit 400 and the component are thermally coupled. That is to say, a thermal tab 500 is configured to be mechanically coupled to a component of a circuitry such that heat generated by the component is spread across one or more layers of the example flexible circuit 400. Though the example embodiment presents the heat-spreading configuration 500 as including two thermal tabs 550-1, 550-2 each disposed at a corresponding end of the example flexible circuit 400, in other embodiments, the heat-spreading configuration 500 includes a different number of thermal tabs 500 each disposed at corresponding points of the example flexible circuit 400.

In some embodiments, example flexible circuit 400 is connected to one or more thermal tabs 550 by a thermal strap

552. Such a thermal strap 552, for example, includes a length of thermally conductive material (e.g., copper, graphite, silver gold) connected at a first end to a thermal tab 550 and a second, opposite end to one or more layers of example flexible circuit 400. According to embodiments, thermal strap 552 includes one or more strands of thermally conducive material arranged, for example, in a braid. In embodiments, each thermal strap 552 is configured to thermally couple one or more layers of the example flexible circuit 400 to a thermal tab 550. That is to say, thermal strap 552 is configured to transfer heat to and from the thermal tab 550 to one or more layers of the example flexible circuit 400. Additionally, according to some embodiments, example flexible circuit 400 further includes one or more thermal layers 554. These thermal layers 554, for example, are each disposed on a respective surface (e.g., top surface, bottom surface) of the example flexible circuit 400 and are each formed from a thermally conductive material such as copper, graphite, silver, gold, or the like. As an example, in some embodiments, a thermal layer 554 includes a graphite sheet. In embodiments, a thermal layer 554 is configured to spread heat from one or more layers of the example flexible circuit 400, a thermal strap 552, a thermal tab 550, or any combination thereof. For example, referring to the embodiment presented in FIG. 5, based on thermal tab 550-1 being mechanically coupled to a component of circuitry, at least a portion of the heat generated by the component travels through the thermal tab 550-1 and through thermal strap 552 to one or more layers (e.g., electrically conductive layers 444, interlayers 442) of the example flexible circuit 400 and thermal layer 554. In some embodiments, one or more thermal tabs 550 are connected only to one or more thermal layers 554 (e.g., via a thermal strap 552) rather than any layers of the example flexible circuit 400. Though the example embodiment in FIG. 5 presents the heat-spreading configuration 500 as including a single thermal layer 554 disposed on a first surface (e.g., bottom surface) of the example flexible circuit 400, in other examples, the heat-spreading configuration 500 also includes a second thermal layer 554 disposed on a second surface (e.g., top surface) of the example flexible circuit 400.

According to some embodiments, a thermal layer 554 includes a prefabricated assembly that is adhered to a surface (e.g., top surface, bottom surface) of the example flexible circuit 400. For example, in some embodiments, a thermal layer 554 includes a prefabricated assembly that is adhered to a surface of the example flexible circuit 400 via a pressure-sensitive adhesive. According to embodiments, this prefabricated assembly of the thermal layer 554 includes one or more thermal tabs 550, thermal straps 552, or both. In this way, during assembly of a display system, the prefabricated assembly of the thermal layer 554 is able to adhere to a surface of example flexible circuit 400 so as to implement heat-spreading configuration 500. Because heat-spreading configuration 500 is able to be implemented during assembly by adhering the prefabricated assembly of thermal layer 554 to a surface of the example flexible circuit 400, heat-spreading configuration 500 is able to be implemented for example flexible circuit 400 without altering or refabricating any of the other circuit boards used to assemble the display system. As such, a display system is enabled to dissipate heat using flexible circuits 400 without needing to refabricate the circuit boards of the components that generate heat.

Figure 6:
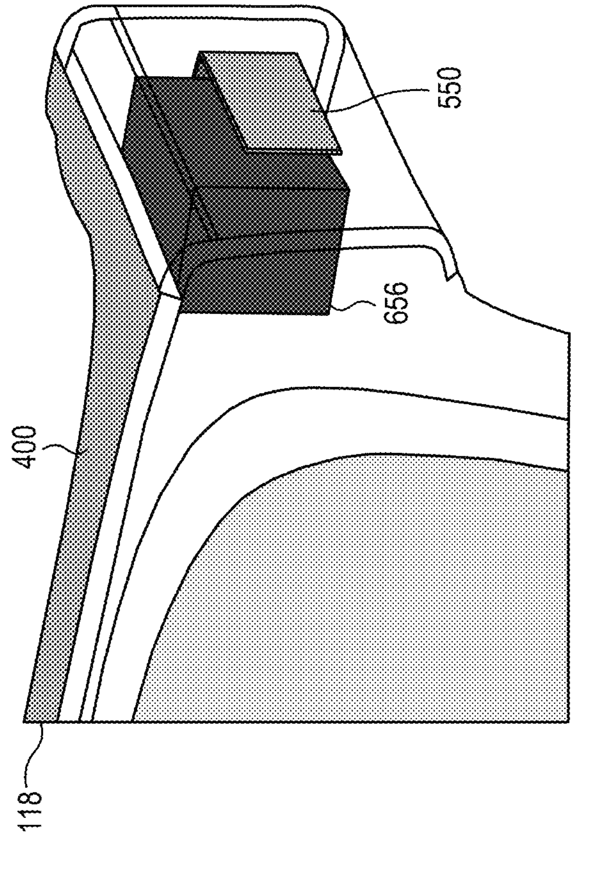
FIG. 6 is a diagram of a display system including a flexible circuit configured for heat spreading, in accordance with some embodiments.

Referring now to FIG. 6, an example display system 600 including a flexible circuit configured for heat dissipation is presented, in accordance with embodiments. According to embodiments, example display system 600 includes a heat-generating component 656 disposed with a support structure 102. For example, within display system 600, the heat-generating component 656 is disposed within a hinge 116 of the support structure. Such a heat-generating component 656, for example, includes a component of a circuitry (e.g., connectivity circuitry 332, sensing circuitry 334, display circuitry 336, audio circuitry 338) such as an interface 305, sensor 342, light engine 222, optical scanner 224, output device 344, input device 346, or any combination thereof. Further, according to embodiments, example display system 600 includes a thermal tab 550 mechanically coupled to the heat-generating component 656. Such a thermal tab 550, for example, is configured to thermally couple the heat-generating component 656 to at least a portion of an example flexible circuit 400 such as, for example, a thermal layer 554 of the example flexible circuit 400. As an example, the thermal tab 550 is configured to thermally couple the heat-generating component 656 to at least a portion of the example flexible circuit 400 via a thermal strap 552.

Within example display system 600, the example flexible circuit 400 is configured to be disposed on a surface of the support structure 102 such that the example flexible circuit 400 runs along a brow 118 of the support structure 102. Due to the example flexible circuit 400 being thermally coupled to the heat-generating component 656 via thermal tab 550, at least a portion of the head generated by heat-generating component 656 travel through the thermal tab 550 to the flexible circuit 400. The flexible circuit 400 then spreads the heat over one or more surfaces of the flexible circuit 400 and at least a portion of the brow 118. Because the flexible circuit 400 spreads at least a portion of the heat generated by heat-generating component 656 in this way, the temperature of the heat-generating component 656 is reduced, allowing the heat-generating component 656 to use more power, processor more quickly, or both. Additionally, because the flexible circuit 400 spreads at least a portion of the heat generated by heat-generating component 656 in this way, a hotspot is less likely to form on the portion of the support structure 102 proximate to the heat-generating component 656, helping to improve the comfort of the user.

Figure 7:
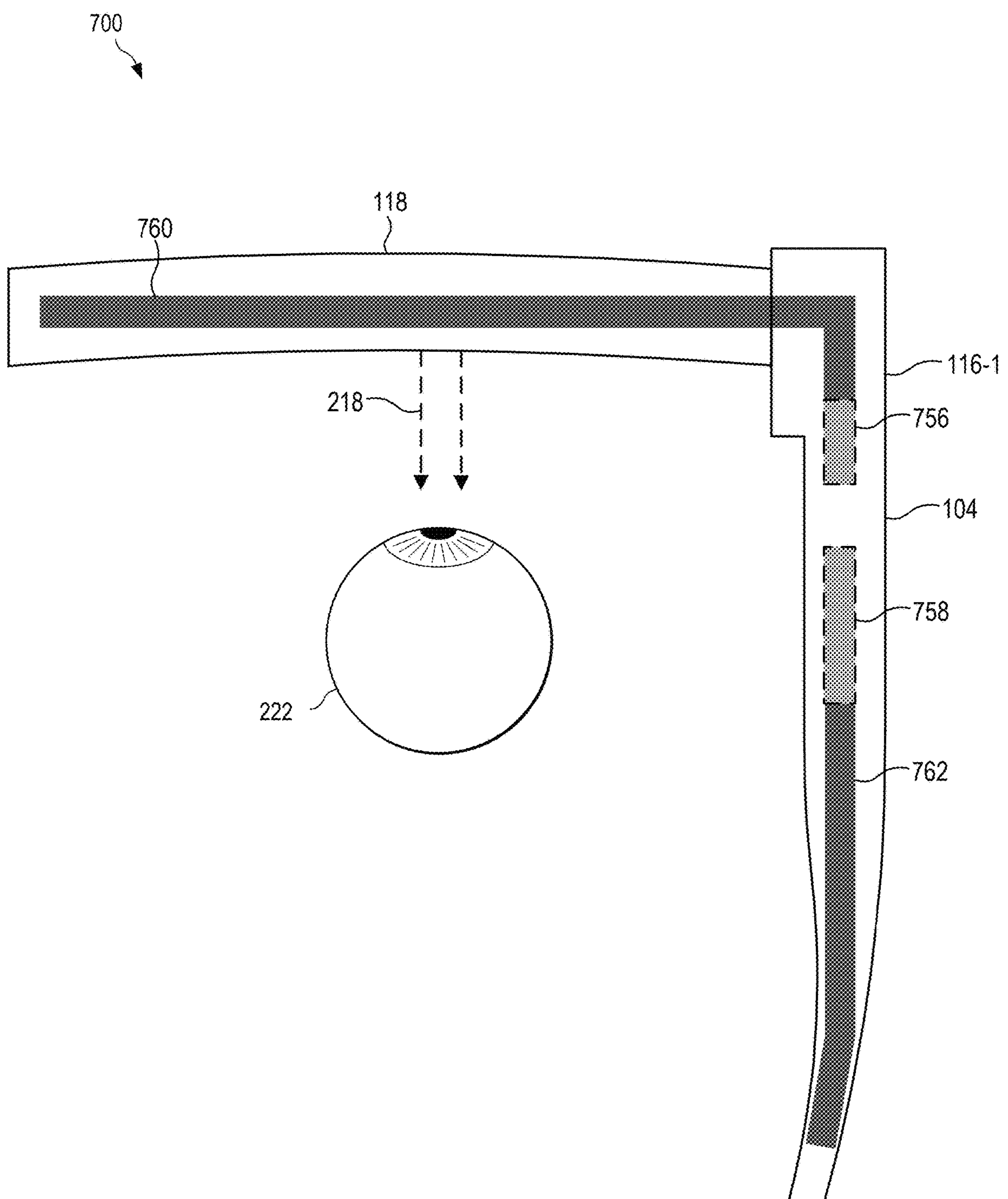
FIG. 7 a partially transparent view of a head-worn display (HWD) including flexible circuits configured for heat spreading, in accordance with some embodiments.

Referring now to FIG. 7, a partially transparent view of a HWD 700 including flexible circuits configured for heat dissipation is presented, in accordance with some embodiments. In embodiments, HWD 700 is configured to provide light 218 representative of an XR image to an eye 230 of the user such that the XR image is presented to the user in a real-world setting. To this end, HWD 700 includes a display system such as display system 100, display system 300, or display system 600. Further, HWD 700 includes a support structure 102 having a brow 118, hinge 116, arm 104, and temple 114. According to some embodiments, HWD 700 includes a first heat-generating component 756 contained (e.g., housed in) the arm 104 of the support structure 102. Such a first heat-generating component 756 includes, for example, an interface 305, sensor 342, light engine 222, optical scanner 224, output device 344, input device 346, or any combination thereof. The first heat-generating component 756, for example, is thermally coupled, via a thermal tab 550, thermal strap 552, or both, to a first flexible circuit 760, similar to or the same example flexible circuit 400. The first flexible circuit 760 is disposed on a surface of or within the support structure 102 such that the first flexible circuit 760 runs along at least a portion of the arm 104, hinge 116, and brow 118 of the support structure 102. Due to the first flexible circuit 760 being thermally coupled to the first heat-generating component 756, one or more surfaces of the first flexible circuit 760, a thermal layer 554 of the first flexible circuit 760, or both are configured to conduct at least a portion of the heat generated by the first heat-generating component 756 such that at least a portion of the heat is spread across one or more surfaces of the first flexible circuit 760, a thermal layer 554 of the first flexible circuit 760, at least a portion of the arm 104, at least a portion of the hinge 116, and at least a portion of the brow 118.

Further, in embodiments, HWD 700 includes a second heat-generating component 758 contained (e.g., housed in) the arm 104 of the support structure 102. Such a second heat-generating component 758 includes, for example, an interface 305, sensor 342, light engine 222, optical scanner 224, output device 344, input device 346, or any combination thereof. The second heat-generating component 758, as an example, is thermally coupled, via a thermal tab 550, thermal strap 552, or both, to a second flexible circuit 762, similar to or the same example flexible circuit 400. The second flexible circuit 762 is disposed on a surface of or within the support structure 102 such that the first flexible circuit 760 runs along at least a portion of the arm 104 and temple 114 of the support structure 102. Due to the second flexible circuit 762 being thermally coupled to the second heat-generating component 758, one or more surfaces of the second flexible circuit 762, a thermal layer 554 of the second flexible circuit 762, or both are configured to conduct at least a portion of the heat generated by the second heat-generating component 758 such that at least a portion of the heat is spread across one or more surfaces of the second flexible circuit 762, a thermal layer 554 of the second flexible circuit 762, at least a portion of the arm 104, and at least a portion of the temple 114.

In some embodiments, certain aspects of the techniques described above may be implemented by one or more processors of a processing system executing software. The software comprises one or more sets of executable instructions stored or otherwise tangibly embodied on a non-transitory computer readable storage medium. The software can include the instructions and certain data that, when executed by the one or more processors, manipulate the one or more processors to perform one or more aspects of the techniques described above. The non-transitory computer readable storage medium can include, for example, a magnetic or optical disk storage device, solid state storage devices such as Flash memory, a cache, random access memory (RAM) or other non-volatile memory device or devices, and the like. The executable instructions stored on the non-transitory computer readable storage medium may be in source code, assembly language code, object code, or other instruction format that is interpreted or otherwise executable by one or more processors.

A computer readable storage medium may include any storage medium, or combination of storage media, accessible by a computer system during use to provide instructions and/or data to the computer system. Such storage media can include, but is not limited to, optical media (e.g., compact disc (CD), digital versatile disc (DVD), Blu-Ray disc), magnetic media (e.g., floppy disc, magnetic tape, or magnetic hard drive), volatile memory (e.g., random access memory (RAM) or cache), non-volatile memory (e.g., read-only memory (ROM) or Flash memory), or microelectromechanical systems (MEMS)-based storage media. The computer readable storage medium may be embedded in the computing system (e.g., system RAM or ROM), fixedly attached to the computing system (e.g., a magnetic hard drive), removably attached to the computing system (e.g., an optical disc or Universal Serial Bus (USB)-based Flash memory) or coupled to the computer system via a wired or wireless network (e.g., network accessible storage (NAS)).

Note that not all of the activities or elements described above in the general description are required, that a portion of a specific activity or device may not be required, and that one or more further activities may be performed, or elements included, in addition to those described. Still further, the order in which activities are listed is not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. A wearable display, comprising:

a support structure;

a light engine configured to emit light representative of an image;

a lightguide to direct the light representative of the image to an eye of a user;

a circuitry configured to provide a first functionality; and a flexible circuit arranged so that:

the flexible circuit is electrically coupled, at a first end, to the circuitry and, at a second end, to a processor or a power source;

the flexible circuit is thermally coupled, at the first end, to the circuitry; and a portion of the flexible circuit between the first end and the second end is in direct contact with a portion of the support structure such that heat generated by the circuitry is spread across the portion of the structure.

2. The wearable display of claim 1, wherein the flexible circuit includes a thermal tab disposed at the first end configured to thermally couple the circuitry to the flexible circuit.

3. The wearable display of claim 1, wherein the flexible circuit includes a thermal layer disposed on a surface of the flexible circuit and configured to spread heat from the circuitry.

4. The wearable display of claim 1, wherein the flexible circuit is configured to run along an arm, hinge, or brow of the support structure.

5. The wearable display of claim 1, wherein the flexible circuit includes a plurality of electrically conductive layers each configured to carry a respective signal.

6. The wearable display of claim 1, wherein the flexible circuit is configured to spread at least a portion of the heat generated by the processor of power source across the at least a portion of the support structure.

7. The wearable display of claim 1, wherein the circuitry comprises at least one from a group of a connectivity circuitry, sensing circuitry, display circuitry, and audio circuitry.

8. A flexible circuit for a wearable display, comprising:

a first end connected to circuitry providing a functionality of the wearable display;

a second end connected to a processor or power source of the wearable display;

a flexible electrically conductive layer configured to electrically couple the circuitry to the processor or the power source; and a thermal tab disposed at the first end and configured to thermally and mechanically couple the circuitry to the flexible circuit such that heat generated by the circuitry is spread across a surface of the flexible circuit, wherein the flexible circuit is configured to run along a least a portion of a support structure of the wearable display.

9. The flexible circuit of claim 8, further comprising:

a thermal layer adhered to the surface of the flexible circuit, the thermal layer configured to spread at least a portion of the heat from the circuitry across the thermal layer.

10. The flexible circuit of claim 9, further comprising:

a thermal strap configured to thermally couple the thermal tab to the thermal layer.

11. The flexible circuit of claim 8, wherein the flexible circuit is configured to run along an arm, hinge, or brow of the support structure of the wearable display.

12. The flexible circuit of claim 8, wherein the flexible circuit is configured to spread at least a portion of the heat generated by the circuitry across the at least a portion of the support structure.

13. The flexible circuit of claim 8, further comprising:

a second flexible electrically conductive layer; and an interlayer disposed between the flexible electrically conductive layer and the second flexible electrically conductive layer.

14. The flexible circuit of claim 8, wherein the thermal tab is configured to mechanically couple to a component of the circuitry.

15. The flexible circuit of claim 8, wherein the circuitry comprises at least one from a group of a connectivity circuitry, sensing circuitry, display circuitry, and audio circuitry.

16. A method, comprising:

electrically coupling, within a wearable display and by a flexible circuit, circuitry of the wearable display configured to provide a functionality of the wearable display to a processor or power source of the wearable display, a portion of the flexible circuit between the circuitry in contact with at least a portion of a support structure of the wearable display; and thermally coupling the circuitry to the flexible circuit such that heat generated by the circuitry is spread across a surface of the flexible circuit and the at least a portion of the support structure.

17. The method of claim 16, wherein the flexible circuit includes a thermal layer adhered to a surface of the flexible circuit, the thermal layer configured to spread at least a portion of the heat from the circuitry across the thermal layer.

18. The method of claim 16, wherein the flexible circuit is configured to run along an arm, hinge, and brow of the support structure of the wearable display.

19. The method of claim 16, wherein the flexible circuit includes a plurality of electrically conductive layers.

20. The method of claim 16, wherein the circuitry comprises at least one from a group of a connectivity circuitry, sensing circuitry, display circuitry, and audio circuitry.

* * * * *